United States Patent
Poplevine et al.

(10) Patent No.: US 6,992,927 B1
(45) Date of Patent: Jan. 31, 2006

(54) NONVOLATILE MEMORY CELL

(75) Inventors: Pavel Poplevine, Foster City, CA (US); Yuri Mirgorodski, Sunnyvale, CA (US); Andrew J. Franklin, Santa Clara, CA (US); Hengyang (James) Lin, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 22 days.

(21) Appl. No.: 10/895,710

(22) Filed: Jul. 8, 2004

(51) Int. Cl.
*G11C 16/04* (2006.01)

(52) U.S. Cl. .............................. 365/185.05; 365/185.1; 365/185.14

(58) Field of Classification Search .......... 365/185.05, 365/185.1, 185.14
See application file for complete search history.

(56) References Cited

U.S. PATENT DOCUMENTS

| | | | |
|---|---|---|---|
| 4,228,527 A * | 10/1980 | Gerber et al. .......... | 365/185.08 |
| 4,698,787 A | 10/1987 | Mukherjee et al. | |
| 5,364,806 A * | 11/1994 | Ma et al. ................... | 438/266 |
| 5,686,332 A * | 11/1997 | Hong .......................... | 438/261 |
| 6,137,723 A | 10/2000 | Bergemont et al. | |
| 6,324,095 B1 * | 11/2001 | McPartland et al. ... | 365/185.05 |

OTHER PUBLICATIONS

U.S. Appl. No. 10/356,422, filed Jan. 30, 2003.
U.S. Appl. No. 10/895,711, filed Jul. 8, 2004.
U.S. Appl. No. 10/895,713, filed Jul. 8, 2004.
U.S. Appl. No. 10/895,712, filed Jul. 8, 2004.

* cited by examiner

*Primary Examiner*—Huan Hoang
(74) *Attorney, Agent, or Firm*—Vedder Price Kaufman & Kammholz, P.C.

(57) ABSTRACT

An integrated nonvolatile memory circuit having a plurality of control devices. Separate devices execute distinct control, erase, write and read operations, thereby allowing each device to be individually selected and optimized for performing its respective operation.

17 Claims, 3 Drawing Sheets

NONVOLATILE MEMORY CELL

BACKGROUND OF THE INVENTION

1. Field of the Invention

The present invention relates to nonvolatile memory (NVM) cell design.

2. Description of the Related Art

The use of solid state NVM devices has increased as more systems and products incorporate increasing numbers of programmable functions and features. Typical NVM cells, such as those used in erasable programmable read only memory (EPROM) devices, typically use two components for each cell: a transistor and a capacitor. In a classical stacked gate cell, a second polysilicon layer is used to create the capacitor. Alternatively, a floating gate capacitor can also be used. Such designs use the transistor in both programming and reading modes of operation, while erasing is done through the transistor or through the capacitor, and coupling to the capacitor determines the operating voltages.

While such a design provides for a compact cell size, the requirement that the transistor and capacitor both be used for multiple functions (e.g., programming, reading, erasing and controlling) prevents such design from being optimized for each function individually.

SUMMARY OF THE INVENTION

In accordance with the presently claimed invention, an integrated nonvolatile memory circuit has a plurality of control devices. Separate devices execute distinct control, erase, write and read operations, thereby allowing each device to be individually selected and optimized for performing its respective operation.

In accordance with one embodiment of the presently claimed invention, an integrated nonvolatile memory circuit having a plurality of control devices includes a plurality of electrodes and a plurality of devices. A memory electrode is for conveying an electrode voltage indicative of a charge state corresponding to a data bit. A control electrode is for conveying a control voltage. A write electrode is for conveying a write voltage. A read electrode is for conveying a read voltage. An erase electrode is for conveying an erase voltage. An input electrode is for conveying an input data signal. An output electrode is for conveying an output data signal. A control device includes at least first and second electrodes connected to the memory and control electrodes, respectively. A write device includes at least first, second and third electrodes connected to the memory, write and input electrodes, respectively. A read device includes at least first, second and third electrodes connected to the memory, read and output electrodes, respectively. An erase device includes at least first and second electrodes connected to the memory and erase electrodes, respectively.

In accordance with another embodiment of the presently claimed invention, an integrated nonvolatile memory circuit having a plurality of control devices includes a shared electrode and a plurality of devices. The shared electrode is adapted to convey an electrode voltage indicative of a charge state corresponding to a data bit. A control device includes at least first and second electrodes, with the first electrode connected to the shared electrode, and is responsive to a control voltage at the second electrode. A write device includes at least first, second and third electrodes, with the first electrode connected to the shared electrode, is responsive to a write voltage at the second electrode, and is adapted to convey an input data signal via the third electrode. A read device with at least first, second and third electrodes, with the first electrode connected to the shared electrode, is responsive to a read voltage at the second electrode, and is adapted to convey an output data signal via the third electrode. An erase device includes at least first and second electrodes, with the first electrode connected to the shared electrode, and is responsive to an erase voltage at the second electrode.

In accordance with still another embodiment of the presently claimed invention, an integrated nonvolatile memory circuit includes a plurality of control devices. A control means is for receiving a control voltage and an electrical charge and in response thereto storing the electrical charge and providing an electrode voltage indicative of the stored electrical charge. A write means is for receiving a write voltage and an input data signal and in response thereto generating the electrical charge. A read means is for receiving a read voltage and the electrode voltage and in response thereto generating an output data signal related to the electrode voltage. An erase means is for receiving an erase voltage and in response thereto substantially depleting the stored electrical charge.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
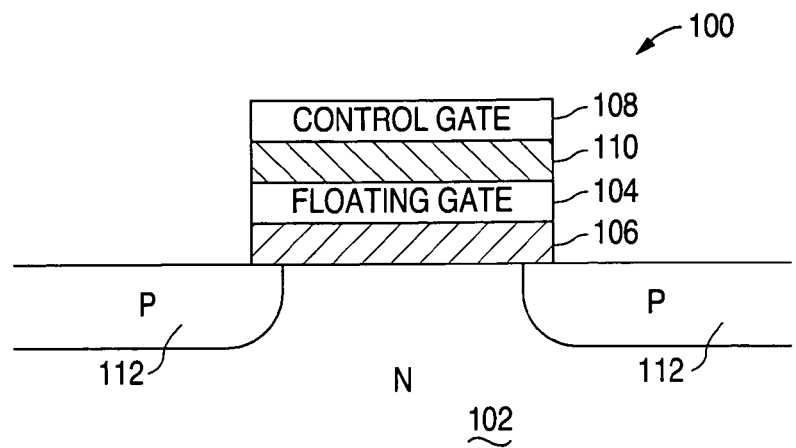
FIG. 1 is a partial cross sectional view of a conventional P-channel insulated gate field effect transistor (P-IGFET) stacked gate NVM cell.

Referring to FIG. 1, a conventional P-IGFET (e.g., P-channel metal oxide semiconductor field effect transistor, or P-MOSFET) stacked gate NVM cell 100 is formed in an N-type region 102 of semiconductor material (e.g., crystalline silicon). As is well known, such N-type region 102 is typically an N-well formed in a P-type silicon substrate. The cell 100 includes a conductive floating gate 104 (e.g., polysilicon) that is separated from the N-type region 102 by a layer of thin gate dielectric material 106 (e.g., silicon dioxide). A control gate electrode 108 (e.g., polysilicon) is separated from the floating gate 104 by a layer of intergate dielectric material 110 (e.g., a sandwich of oxide-nitride-oxide). Two P-type diffusion regions 112 formed at the sides of the stacked gate structure provide the source and drain regions of the cell 100 and define an N-type channel region between them. Fabrication techniques available for making such cells 100 are well known.

As is well known, such a cell uses hot electron injection in a conventional method of programming NVM cells. When applied to such a stacked gate cell 100, the hot electron injection programming method assumes that a high negative voltage is applied to the drain region of the cell 100. Depending upon the erasing and coupling coefficient(s), a corresponding voltage is applied to the control gate 108, thereby bringing the potential of the floating gate 104 to a value that is negative but lower in absolute value as compared with the drain potential. Under such conditions, a high lateral electrical field is generated, thereby creating hot electrons, which are affected by a high perpendicular electrical field such that the hot electrons tunnel through the thin gate oxide 106 to reach the floating gate 104. The amount of injection current depends primarily upon the potentials of the drain region and floating gate electrodes such that with more drain voltage more injection takes place. (Further discussion of such a memory cell and programming technique can be found in U.S. Pat. No. 6,137,723, the disclosure of which is incorporated herein by reference.)

Figure 2:
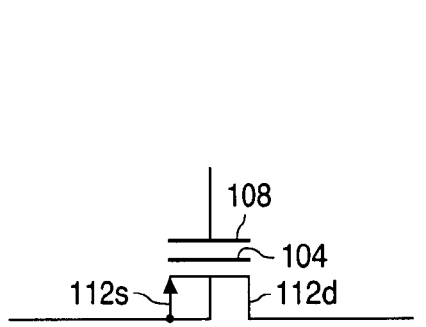
FIG. 2 is a schematic diagram for the NVM cell of FIG. 1.

Referring to FIG. 2, the memory cell 100 of FIG. 1 can be represented in electrical schematic form as shown.

Figure 3:
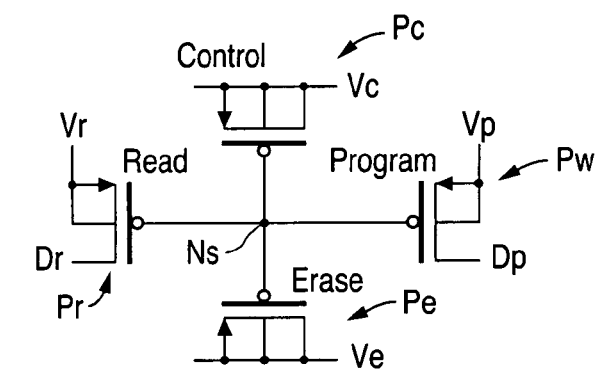
FIG. 3 is a schematic diagram of a NVM cell in accordance with one embodiment of the presently claimed invention.

Referring to FIG. 3, a memory cell 200 in accordance with one embodiment of the presently claimed invention includes four P-IGFETs, with one transistor for each of the cell functions (programs or write, read, erase and control). Such a cell 200, while being somewhat larger in size or circuit area than a conventional stacked gate cell within an integrated circuit environment, allows for independent and improved optimization of each cell function.

The program, or write, function is controlled by a transistor Pw with interconnected source and bulk regions to which a programming voltage Vp is applied, a drain region to which a programming signal Dp is applied, and a gate electrode connected to the storage node Ns. The read function is controlled by a transistor Pr having interconnected source and bulk regions to which a read voltage Vr is applied, a drain region from which a read signal Dr is received, and a gate electrode connected to the storage node Ns. The erase function is controlled by a transistor Pe having interconnected drain, source and bulk regions to which an erase voltage Ve is applied, and a gate electrode connected to the storage node Ns. The control function is controlled by a transistor Pc having interconnected drain, source and bulk regions to which a control voltage Vc is applied, and a gate electrode connected to the storage node Ns.

Such a memory cell 200 can be programmed in any of a number of ways including conventional techniques as follows. During programming, or writing, a programming voltage Vp (e.g., approximately 5 volts) is applied, with all other electrodes being connected to the circuit reference potential (e.g., ground). During erasing, an erase voltage Ve is applied (e.g., approximately 10 volts), with all other electrodes connected to the circuit reference potential. During reading, a read voltage Vr is applied (e.g., approximately 1 volt), and all other electrodes are connected to the circuit reference potential. (Such voltages are typical for oxide thicknesses in the range of 60–80 Angstroms.)

Figure 4:
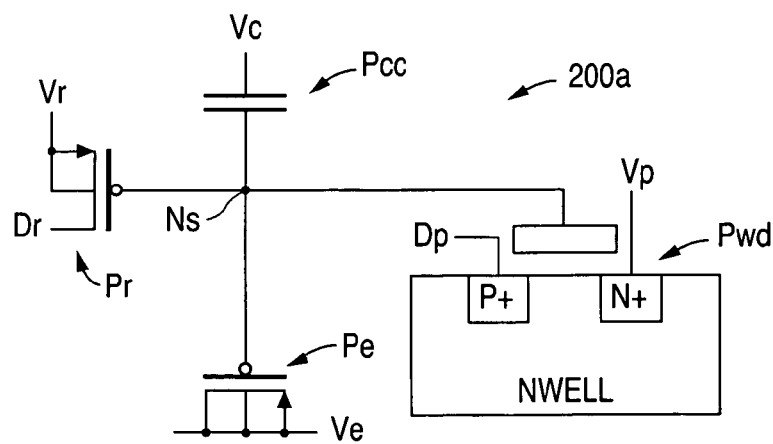
FIG. 4 is a schematic diagram of a NVM cell in accordance with another embodiment of the presently claimed invention.

Referring to FIG. 4, a memory cell 200a in accordance with another embodiment of the presently claimed invention is similar in design in that four separate devices are used for controlling the four respective functions (program, read, erase, control). However, as can be seen, the device Pcc used for the control function can be a capacitor instead of a transistor. Similarly, the programming, or writing, function can be controlled through the use of a gated diode Pwd instead of a transistor Pw. Hence, with reference to FIGS. 3 and 4, it can be seen that a memory cell in accordance with the presently claimed invention may include four transistors, three transistors and a capacitor, three transistors and a gated diode, or a combination of two transistors, a capacitor and a gated diode.

Figure 5:
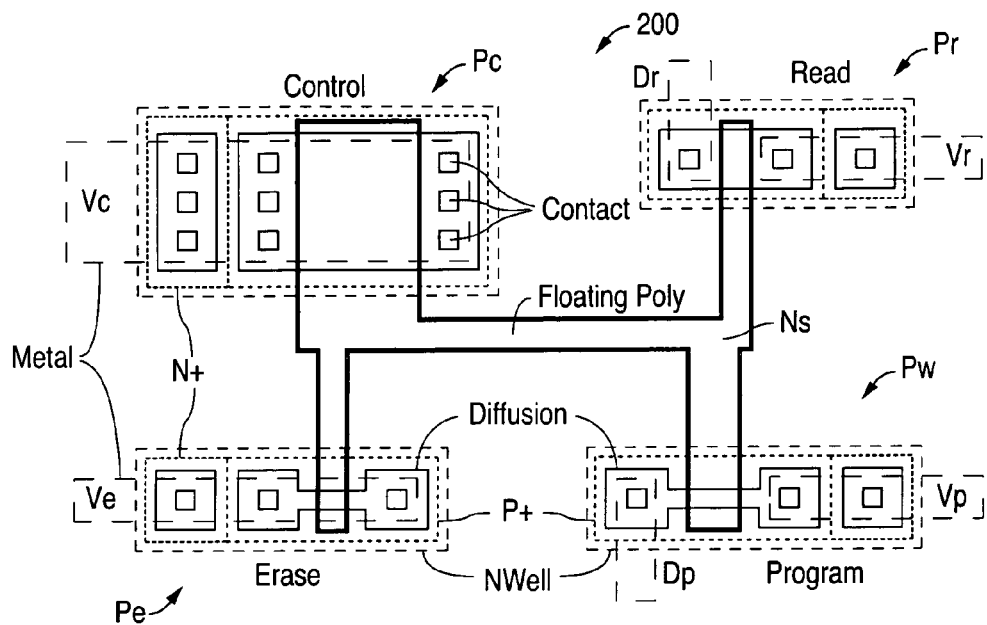
FIG. 5 is a plan view of a portion of an integrated circuit containing a NVM cell in conformance with the schematic diagram of FIG. 3.

Referring to FIG. 5, the design flexibility available with such a memory cell 200 can be better appreciated. For example, larger transistors can be used for the read function, thereby increasing the read signal current and speed. Conversely, a smaller transistor can be used for the programming, or writing, function, thereby reducing programming current and capacitance. Also, using an independent device for the control function allows different voltages to be used for the various functions, thereby allowing for optimization for each function.

Figure 6:
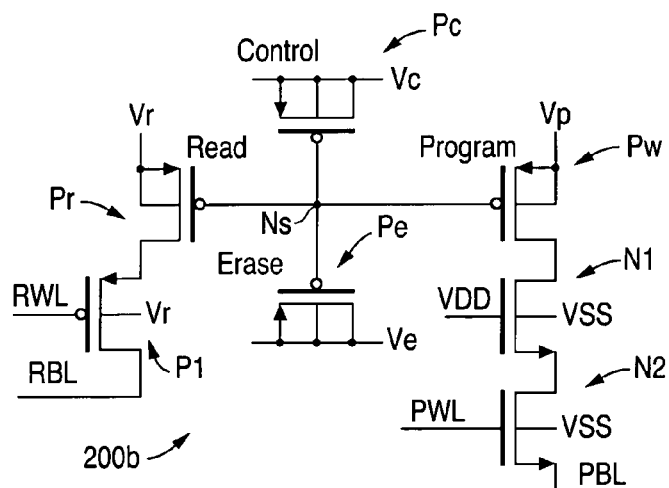
FIG. 6 is a schematic diagram of a NVM cell in accordance with another embodiment of the presently claimed invention.

Referring to FIG. 6, a memory cell 200b in accordance with another embodiment of the presently claimed invention includes additional transistors P1, N1, N2 for facilitating the use of such a memory cell 200b within an array of such cells. For example, to read data from the storage node Ns, a P-channel pass transistor P1 is used. To program data to the storage node Ns, a cascode circuit of two N-channel pass transistors N1, N2 is used to prevent a high voltage from appearing between a gate electrode and a drain or source region.

Figure 7:
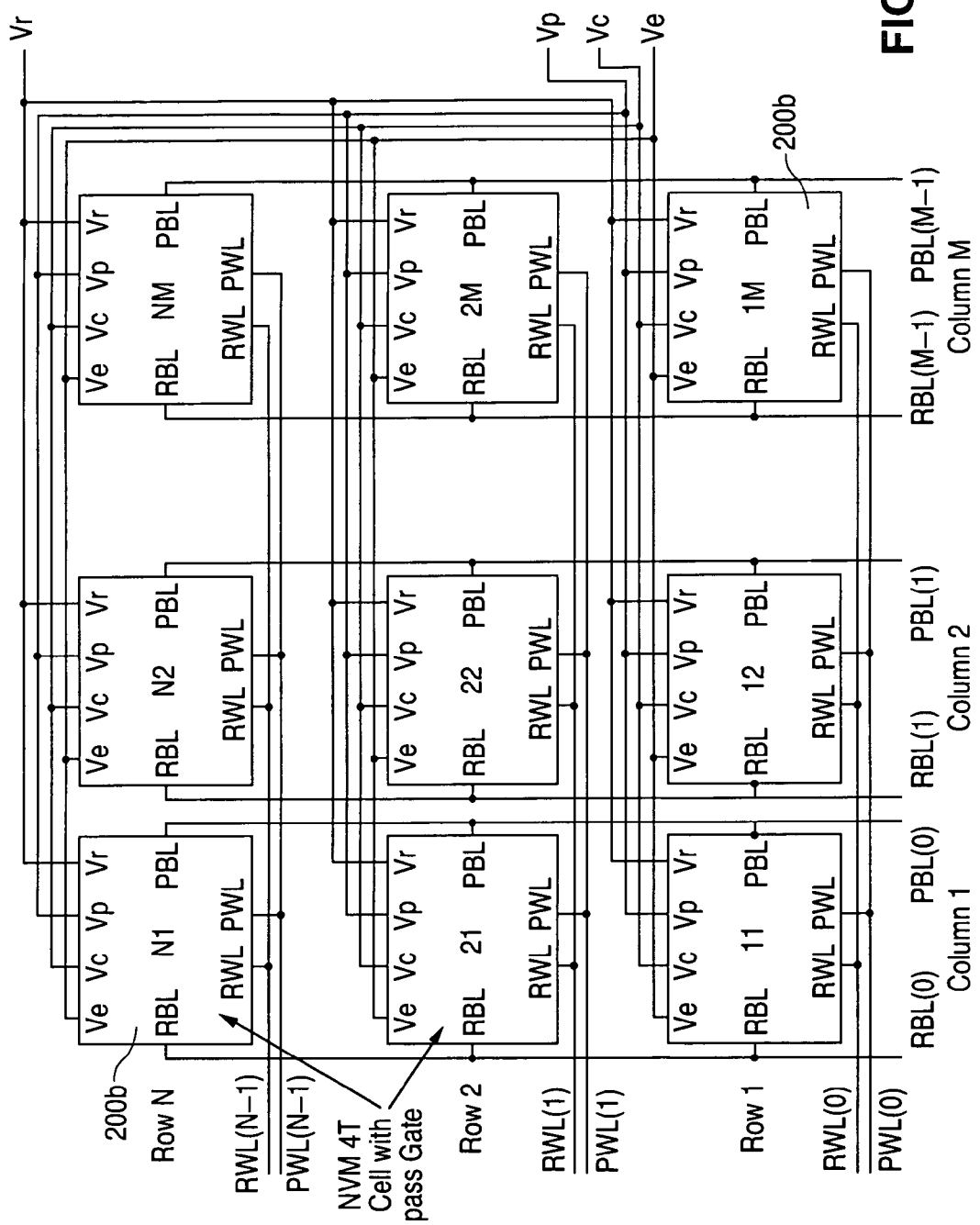
FIG. 7 is a functional block diagram of a NVM cell array composed of a plurality of NVM cells in conformance with the schematic diagram of FIG. 6.

Referring to FIG. 7, the memory cell 200b of FIG. 6 can be incorporated into an array as shown. Such an array has M columns and N rows. The program word line PWL selects the rows to be programmed, while the read word line RWL selects the rows to be read. The erase voltage Ve, program voltage Vp, control voltage Vc and read voltage Vr are applied to each cell directly. With no high voltage switches or other supporting circuitry, significantly simplified connections can be made from the external or internal voltage and signal sources and to the signal destinations.

The operational modes of erase, program and read are similar to those for a single cell. During erase mode, the program word lines PWL(0)-PWL(N−1) are at a logic low, the read word lines RWL(0)-RWL(N−1) are at a logic high, the erase voltage Ve is applied, and the rest of the signal lines are at circuit reference potential. This causes all cells to be erased.

During programming mode, the read word lines RWL(0)-RWL(N−1) are at a logic high, one of the program word lines, e.g., PWL(0), will be at a logic high while the remaining program word lines, e.g., PWL(1)-PWL(N−1), will be at a logic low. To program a particular cell 200b, the corresponding program bit line, e.g., PBL(0), will be at a logic low. To erase the remaining cells 200b, the corresponding program bit lines, e.g., PBL(1)-PBL(M−1), will be left floating. The program voltage Vp is applied to all cells 200b, while the remaining electrodes are at circuit reference potential.

During the read mode of operation, the program word lines PWL(0)-PWL(N−1) are at a logic low, one of the read word lines, e.g., RWL(0), will be at a logic low, while the remaining read word lines, e.g., RWL(1)-RWL(N−1) will be at a logic high. On each of the read bit lines RBL(0)-RBL(M−1) a high current or voltage will be received for each corresponding cell that had been programmed, while a low current or voltage will be received for each corresponding cell that had been erased. The read voltage Vr is applied to all cells 200b, while the remaining electrodes are at circuit reference potential.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an integrated nonvolatile memory circuit having a plurality of control devices, comprising:
   a memory electrode for conveying an electrode voltage indicative of a charge state corresponding to a data bit;
   a control electrode for conveying a control voltage;
   a write electrode for conveying a write voltage;
   a read electrode for conveying a read voltage;
   an erase electrode for conveying an erase voltage;
   an input electrode for conveying an input data signal;
   an output electrode for conveying an output data signal;
   a control device with at least first and second electrodes connected to said memory and control electrodes, respectively;
   a write device with at least first, second and third electrodes connected to said memory, write and input electrodes, respectively;
   a read device with at least first, second and third electrodes connected to said memory, read and output electrodes, respectively; and
   an erase device with at least first and second electrodes connected to said memory and erase electrodes, respectively.

2. The apparatus of claim 1, wherein said memory electrode comprises a floating electrode.

3. The apparatus of claim 1, wherein selected ones of said control, write, read and erase devices comprise a plurality of insulated gate field effect transistors (IGFETs).

4. The apparatus of claim 3, wherein said control device comprises a capacitor.

5. The apparatus of claim 3, wherein said write device comprises a gated diode.

6. The apparatus of claim 3, wherein said plurality of insulated gate field effect transistors (IGFETs) comprises a plurality of metal oxide semiconductor field effect transistors (MOSFETs).

7. The apparatus of claim 1, wherein said control device comprises a capacitor.

8. The apparatus of claim 1, wherein said write device comprises a gated diode.

9. An apparatus including an integrated nonvolatile memory circuit having a plurality of control devices, comprising:
   a shared electrode adapted to convey an electrode voltage indicative of a charge state corresponding to a data bit;
   a control device with at least first and second electrodes, with said first electrode connected to said shared electrode, and responsive to a control voltage at said second electrode;
   a write device with at least first, second and third electrodes, with said first electrode connected to said shared electrode, responsive to a write voltage at said second electrode, and adapted to convey an input data signal via said third electrode;
   a read device with at least first, second and third electrodes, with said first electrode connected to said shared electrode, responsive to a read voltage at said second electrode, and adapted to convey an output data signal via said third electrode; and
   an erase device with at least first and second electrodes, with said first electrode connected to said shared electrode, and responsive to an erase voltage at said second electrode.

10. The apparatus of claim 9, wherein said memory electrode comprises a floating electrode.

11. The apparatus of claim 9, wherein selected ones of said control, write, read and erase devices comprise a plurality of insulated gate field effect transistors (IGFETs).

12. The apparatus of claim 11, wherein said control device comprises a capacitor.

13. The apparatus of claim 11, wherein said write device comprises a gated diode.

14. The apparatus of claim 11, wherein said plurality of insulated gate field effect transistors (IGFETs) comprises a plurality of metal oxide semiconductor field effect transistors (MOSFETs).

15. The apparatus of claim 11, wherein said control device comprises a capacitor.

16. The apparatus of claim 11, wherein said write device comprises a gated diode.

17. An apparatus including an integrated nonvolatile memory circuit having a plurality of control devices, comprising:
   control means for receiving a control voltage and an electrical charge and in response thereto storing said electrical charge and providing an electrode voltage indicative of said stored electrical charge;
   write means for receiving a write voltage and an input data signal and in response thereto generating said electrical charge;
   read means for receiving a read voltage and said electrode voltage and in response thereto generating an output data signal related to said electrode voltage; and
   erase means for receiving an erase voltage and in response thereto substantially depleting said stored electrical charge.

* * * * *

UNITED STATES PATENT AND TRADEMARK OFFICE
CERTIFICATE OF CORRECTION

PATENT NO. : 6,992,927 B1
DATED : January 31, 2006
INVENTOR(S) : Pavel Poplevine et al.

It is certified that error appears in the above-identified patent and that said Letters Patent is hereby corrected as shown below:

<u>Column 6,</u>
Lines 43 and 45, delete "claim 11" and insert -- claim 9 --.

Signed and Sealed this

Eleventh Day of April, 2006

JON W. DUDAS
*Director of the United States Patent and Trademark Office*